(12) United States Patent
Balasubramaniam

(10) Patent No.: US 11,281,246 B2
(45) Date of Patent: Mar. 22, 2022

(54) CIRCUIT FOR DETECTING CIRCUIT DEFECTS AND FOR PREVENTING OVERVOLTAGES IN CONTROLLERS

(71) Applicant: Robert Bosch GmbH, Stuttgart (DE)

(72) Inventor: Harish Balasubramaniam, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/961,895

(22) PCT Filed: Nov. 23, 2018

(86) PCT No.: PCT/EP2018/082313
§ 371 (c)(1),
(2) Date: Aug. 26, 2020

(87) PCT Pub. No.: WO2019/141416
PCT Pub. Date: Jul. 25, 2019

(65) Prior Publication Data
US 2021/0004033 A1 Jan. 7, 2021

(30) Foreign Application Priority Data
Jan. 17, 2018 (DE) ...................... 10 2018 200 668.7

(51) Int. Cl.
*G05F 1/565* (2006.01)
*G05F 1/567* (2006.01)
(Continued)

(52) U.S. Cl.
CPC .............. *G05F 1/563* (2013.01); *G05F 1/571* (2013.01); *G05F 1/575* (2013.01); *G05F 1/59* (2013.01); *H03K 17/0822* (2013.01)

(58) Field of Classification Search
CPC ........... G05F 1/565–5735; G05F 1/575; G05F 1/563–565; G05F 1/59–595; H03K 17/0822
See application file for complete search history.

(56) References Cited

U.S. PATENT DOCUMENTS 6,281,668 B1 * 8/2001 Sudo .................... H02M 3/156
 323/299
7,576,964 B2 8/2009 Nakahara
(Continued)

FOREIGN PATENT DOCUMENTS

CN 101060283 A 10/2007
CN 203071816 U 7/2013
(Continued)

OTHER PUBLICATIONS

International Search Report dated Apr. 4, 2019 in connection with International Application No. PCT/EP2018/082313.

*Primary Examiner* — Sisay G Tiku
(74) *Attorney, Agent, or Firm* — Norton Rose Fulbright US LLP; Gerard Messina

(57) ABSTRACT

An electrical circuit for detecting circuit defects and/or for preventing overvoltages in controllers. The electrical circuit including a power controller circuit, encompassing a first transistor, a control loop including an operation amplifier and a first reference voltage source, and feedback resistors, and an overvoltage suppression circuit, encompassing a second transistor, a control loop including an operation amplifier and a reference voltage source, and feedback resistors, the power controller circuit being provided to make a voltage available for the overvoltage suppression circuit and the overvoltage suppression circuit being provided to make a protected voltage available.

13 Claims, 5 Drawing Sheets

(51) Int. Cl.
*G05F 1/569* (2006.01)
*G05F 1/571* (2006.01)
*G05F 1/573* (2006.01)
*G05F 1/575* (2006.01)
*G05F 1/59* (2006.01)
*G05F 1/563* (2006.01)
*H03K 17/082* (2006.01)

(56) References Cited

U.S. PATENT DOCUMENTS

| | | | |
|---|---|---|---|
| 7,768,324 B1 * | 8/2010 | Limotyrakis | H03K 19/0019 327/108 |
| 8,294,440 B2 * | 10/2012 | Lowe, Jr. | G05F 1/56 323/273 |
| 9,007,737 B2 | 4/2015 | Lee | |
| 9,665,112 B2 * | 5/2017 | Singh | G05F 1/56 |
| 9,958,891 B1 * | 5/2018 | Furth | G05F 1/575 |
| 10,056,777 B2 * | 8/2018 | Kong | H02J 7/0072 |
| 10,067,520 B2 * | 9/2018 | Iwata | G05F 1/59 |
| 10,599,172 B2 * | 3/2020 | Hayashi | G05F 1/571 |
| 2005/0110477 A1 | 5/2005 | Mauthe | |
| 2008/0136500 A1 * | 6/2008 | Frulio | H02M 3/07 327/536 |
| 2009/0033298 A1 * | 2/2009 | Kleveland | G05F 1/575 323/271 |
| 2010/0201331 A1 | 8/2010 | Imura | |
| 2012/0026532 A1 * | 2/2012 | Arimoto | H02J 9/005 358/1.14 |
| 2012/0086419 A1 * | 4/2012 | Bai | H04R 1/04 323/280 |
| 2012/0146602 A1 * | 6/2012 | Chen | H02M 3/1582 323/282 |
| 2015/0061622 A1 | 3/2015 | Bhattad | |
| 2016/0334818 A1 | 11/2016 | Singh et al. | |
| 2016/0359411 A1 * | 12/2016 | Ihs | H02M 3/157 |
| 2017/0201086 A1 * | 7/2017 | Chen | H02H 3/08 |

FOREIGN PATENT DOCUMENTS

| | | |
|---|---|---|
| CN | 102393779 B | 4/2014 |
| CN | 105915050 A | 8/2016 |
| JP | S5734217 A | 2/1982 |
| JP | S5757319 A | 4/1982 |

* cited by examiner

CIRCUIT FOR DETECTING CIRCUIT DEFECTS AND FOR PREVENTING OVERVOLTAGES IN CONTROLLERS

FIELD

The present invention relates to an electrical circuit for detecting circuit defects and/or for preventing overvoltages in controllers, including a power controller circuit and an overvoltage suppression circuit, the power controller circuit being provided in order to make a voltage available for the overvoltage suppression circuit and the overvoltage suppression circuit being provided in order to make a protected voltage available.

BACKGROUND INFORMATION

Various methods are available in the related art, with the aid of which an overvoltage in an electrical circuit may be detected.

U.S. Pat. No. 7,576,964 B2 describes, for example, an overvoltage protection circuit for a circuit of a MOS transistor and a consumer, which is connected in series between a first power supply and a second power supply. The overvoltage protection circuit contains a control signal circuit, a dynamic clamp circuit, a control switch, and an overvoltage detection circuit.

Moreover, U.S. Pat. No. 9,007,737 B2 describes an overvoltage protection circuit encompassing a resistor divider, a reference voltage supply unit, a comparator, and an inverter, the inverter being made up of a series-parallel combination circuit of first through third semiconductor switch elements, which are activated by the output of the comparator. The first semiconductor switch element and the second semiconductor switch element or the third semiconductor switch element are activated by receiving the output signal of the comparator and output an external voltage when the external voltage is within the range of the voltage necessary for an internal circuit. In this way, the external voltage flows to ground and, thereby, brings the voltage present at the internal circuit to 0 volts, in order to protect the internal circuit against an external overvoltage.

In addition, the document "Low drop regulator with overvoltage protection and reset function for automotive environment" of the Institute of Electrical and Electronics Engineers (IEEE) describes how a bipolar high-voltage process allows for an integration of a voltage regulator, which may operate having a minimal voltage drop and withstand positive and negative overvoltages up to 80 volts. A power-side, fully surface-protected PNP transistor allows for this large range of use, which is required, in particular, for automotive and industrial applications. A so-called "Zener zap trim" reference allows for a precise switch-on and switch-off of the reset logic without adjustable or highly precise external components.

In the aforementioned methods, overvoltage events are avoided or detected, in that the destruction of the output MOS transistor is prevented by utilizing an overvoltage detection and clamp circuit, whereby the output MOS transistor is switched off and the output voltage is drawn to ground, or a switch-off of the output power PNP transistor takes place.

In each of the methods, it is assumed that the output MOS/PNP transistor has no defect such as a short circuit between the drain and the source or between the collector and the emitter.

Such a defect may cause an external battery voltage to occur directly at the load or at the consumer without any regulation, which results in the destruction of the on-chip circuits and the load or the consumer. This is important in the automotive field, since the battery voltages are nominally 14 volts and may increase in the case of a load deposit.

SUMMARY

According to an example embodiment of the present invention, an electrical circuit is provided for detecting circuit defects and/or for preventing overvoltages in controllers, including a power controller circuit, encompassing a first transistor, a control loop including an operation amplifier and a first reference voltage source, and feedback resistors, and an overvoltage suppression circuit, encompassing a second transistor, a control loop including an operation amplifier and a reference voltage source, and feedback resistors, the power controller circuit being provided in order to make a voltage available for the overvoltage suppression circuit and the overvoltage suppression circuit being provided in order to make a protected voltage available.

The present invention makes it possible not only to detect defects in the various sub-circuits of a controller, but also in the output MOS transistor itself. Every defect in the sub-circuits and the output MOS transistor may cause an overvoltage or undervoltage event, which causes a malfunction or the destruction of the chip.

In addition, the present invention makes it possible not only to detect overvoltage events, but rather limits these as well, so that digital logic and load circuits operating in the range from 2.7 volts to 3.6 volts may function properly. This enables the digital logic to take up appropriate measures, such as the measure of a controlled switch-off. The voltage suppression circuit limits the voltage to the maximum operating range of the supplied circuits, so that these function properly also in the presence of a defect, such as a drain-source short circuit of the power transistor. This is particularly useful for the application in the automotive field, in which an uncontrolled switch-off may result in an undesirable behavior.

Advantageously, moreover, the electrical circuit encompasses a third transistor, whose gate terminal is connected to the source terminal of the second transistor of the overvoltage suppression circuit and which is provided in order to limit an overvoltage at the source terminal of the third transistor. As a result, it may be achieved, according to the present invention, that a voltage value above 3.6 volts at the drain terminal of the third transistor will not be permitted at the source terminal.

According to a particular example embodiment of the electrical circuit, an input of a comparator is connected at the source terminal of the third transistor, which is provided for detecting an overvoltage by comparing the limited voltage to a voltage of the second reference voltage source. In this way, a further-processable, binary output signal is generatable, which indicates the presence of an overvoltage.

Preferably, the first comparator, which is provided for detecting an overvoltage, is provided for outputting a binary value representing an overvoltage. This makes it possible that defects in the second reference voltage source, which result in a lower target value, may be detected by the first comparator despite the utilization of the same second reference voltage source by a second comparator and the protection controller.

In one advantageous example embodiment, moreover, the electrical circuit encompasses a circuit for detecting an undervoltage of the power controller including a second comparator comparing the voltage of the second reference voltage source to a voltage obtained via the provided protected voltage. As a result, a further-processable, binary output signal may be generated, which indicates the presence of an undervoltage.

In one particular specific example embodiment of the present invention, the comparator provided for detecting an undervoltage is provided for outputting a binary value representing an undervoltage. As a result, it may be achieved that a predefined voltage value is not fallen below, so that digital logic and load circuits operating in the range from 2.7 volts to 3.6 volts may function properly.

According to one alternative specific example embodiment of the present invention, moreover, the electrical circuit encompasses a circuit for detecting an undervoltage of the power controller including two comparators, a comparison of the voltage obtained via the voltage of the first or second reference voltage source to a voltage obtained with the aid of the provided protected voltage being provided. As a result, a considerable distinction may be made between an overvoltage with respect to the voltage provided by the power controller circuit and an undervoltage with respect to the provided protected voltage.

Advantageously, the two comparators are provided for outputting a binary value representing an undervoltage. According to one preferred specific embodiment of the present invention, moreover, a logic AND gate is provided for linking the binary values reflecting an undervoltage. As a result, in the case of a voltage provided by the power controller circuit which falls considerably below a predefined value, an output value is additionally set to 1, so that a defect in the second reference voltage source may be detected.

According to one further alternative specific example embodiment of the present invention, moreover, the electrical circuit encompasses an undervoltage detection comparator including a variable reference source for detecting a defect in the reference sources, which results in an overvoltage of the power controller or an undervoltage of the protection controller. As a result, a considerable distinction may be made between an overvoltage and an undervoltage on the basis of defects in the controllers and defects in the references.

Preferably, the electrical circuit according to the present invention encompasses a digital portion, at which a provision of the protected voltage is provided. Due to such a digital portion, in particular, certain components of the electrical circuit, such as power controllers and/or comparators, may be electrically simulated.

According to one further advantageous variant of the present invention, the digital portion encompasses inputs for receiving binary values and outputs for transmitting binary values. Due to the transmission of binary values, for example, a controlled switch-off of load circuits may be initiated on the basis of received binary values, in order to prevent damage at the electrical circuit and/or at their consumers or load circuits.

According to the present invention, it may be provided, moreover, that a supply of the first reference voltage source, the second reference voltage source, the power controller circuit, and the overvoltage suppression circuit is provided with the aid of an external battery voltage.

Advantageous refinements of the present invention are described herein and are shown in the figures.

BRIEF DESCRIPTION OF THE DRAWINGS

Exemplary embodiments of the present invention are described in greater detail with reference to the figures and the following description.

DETAILED DESCRIPTION OF EXAMPLE EMBODIMENTS

Figure 1:
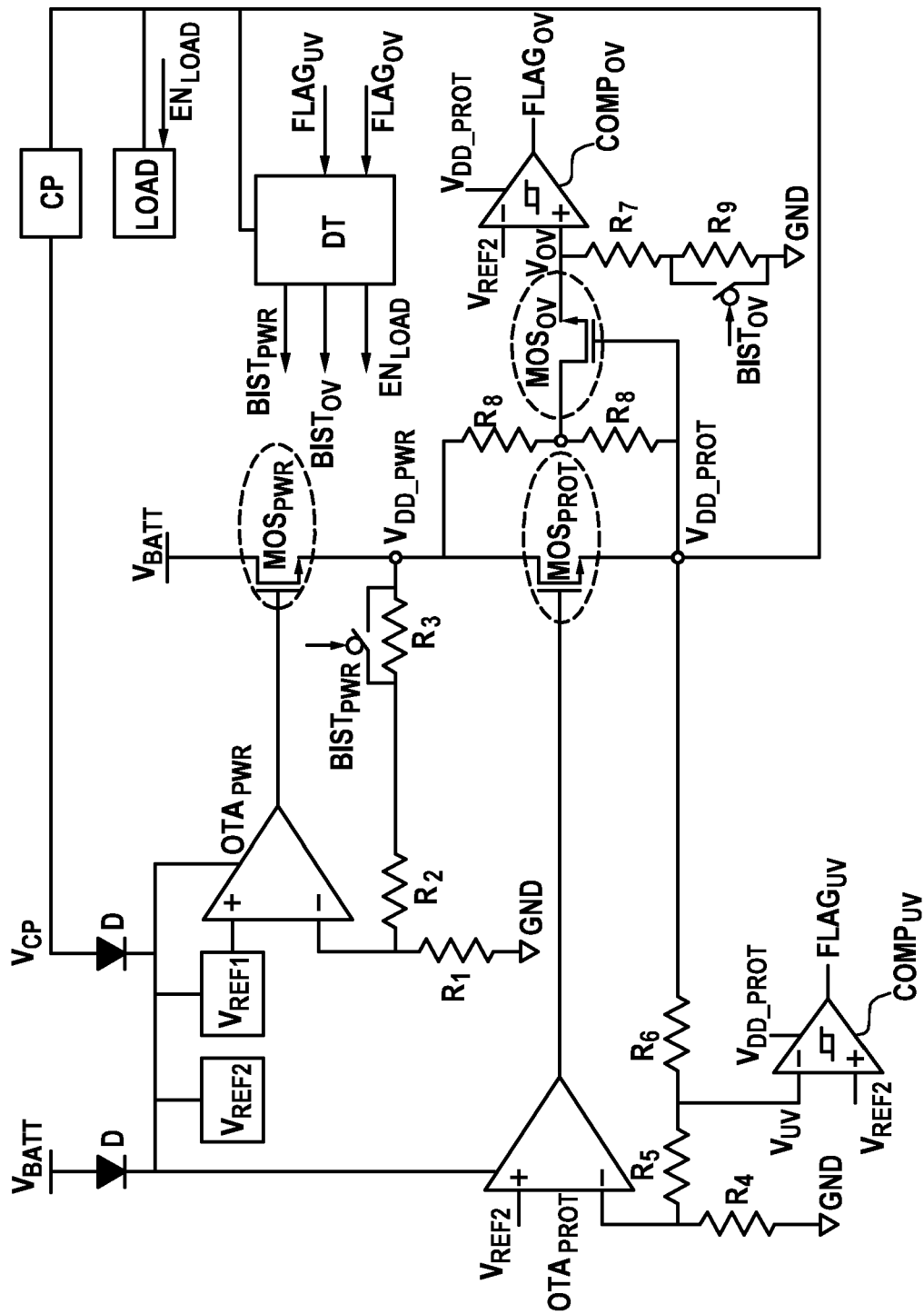
FIG. 1 shows a circuit according to an example embodiment of the present invention for detecting defects and for overvoltage suppression.

In FIG. 1, an example circuit according to the present invention for detecting defects and for overvoltage suppression for a high-voltage BCD (bipolar, CMOS and DMOS) semiconductor method is represented, which is suitable for applications in the automotive field. An adaptation of the circuit to other semiconductor processes is also possible.

The controller is supplied by a battery having voltage $V_{BATT}$. The power controller contains high-voltage transistor $MOS_{PWR}$, a control loop including operation amplifier $OTA_{PWR}$ and undervoltage band gap reference $V_{REF1}$ as the reference voltage source, and high-resistance feedback resistors $R_1$, $R_2$ and $R_3$. The power controller delivers voltage $V_{DD\_PWR}$ for the overvoltage suppression circuit.

The overvoltage suppression circuit contains high-voltage protection transistor $MOS_{PROT}$, the control loop including operation amplifier $OTA_{PROT}$ and undervoltage band gap reference $V_{REF2}$ as the reference voltage source, and high-resistance feedback resistors $R_4$, $R_5$ and $R_6$. The overvoltage suppression circuit delivers protected voltage $V_{DD\_PROT}$ to digital logic, represented by digital portion DT, and load circuits LOAD, CP.

Charge pump CP supplied by voltage $V_{DD\_PROT}$ delivers, for operation amplifiers $OTA_{PWR}$ and $OTA_{PROT}$, a higher voltage $V_{CP}$ at a lower $V_{BATT}$ voltage, so that the voltage at the drain and source terminals of transistors $MOS_{PWR}$ and $MOS_{PROT}$ is limited only by way of their start-up resistors and load currents, and not by way of their control voltage at the gate.

For better clarity of the circuit according to the present invention, the following relationships are given:

$$R_2 = R_1 * 2085/1215 \tag{1}$$

$$R_3 = R_1 * 300/1215 \tag{2}$$

$$R_5 = R_4 * 288/1215 \tag{3}$$

$$R_6 = R_4 * 1897/1215 \tag{4}$$

$$R_8 = R_7 * 4670/1215 \tag{5}$$

$$R_9 = R_7 * 55/1215 \tag{6}$$

$$V_{DD\_PWR} = V_{REF1} * (3300 + (BIST_{PWR} * 300))/1215 \tag{7}$$

$$V_{DD\_PROT} = V_{DD\_PWR} \text{ for } V_{DD\_PWR} < 3.4 \text{ V} \tag{8a}$$

$$V_{DD\_PROT} = V_{REF2} * 3400/1215 \text{ for } V_{DD\_PWR} \geq 3.4 \text{ V} \tag{8b}$$

$$V_{UV} = V_{DD\_PROT} * 1503/3400 \tag{9}$$

$$V_{OV} = (V_{DD\_PWR} + V_{DD\_PROT})/(2 + (4670/(1215 + (BIST_{OV} * 55)))) \tag{10}$$

$$FLAG_{UV} = 1 \text{ for } V_{UV} < V_{REF2} \tag{11a}$$

$$FLAG_{UV} = 0 \text{ for } V_{UV} \geq V_{REF2} \tag{11b}$$

$$FLAG_{OV} = 0 \text{ for } V_{OV} < V_{REF2} \tag{12a}$$

$$FLAG_{OV} = 1 \text{ for } V_{OV} \geq V_{REF2} \tag{12b}$$

In the present case, a nominal value of 14 volts is assumed for parameter $V_{BATT}$, a nominal value of >7 volts is assumed for parameter $V_{CP}$ representing the output voltage of the charge pump, a nominal value of 1.215 volts is assumed, in each case, for undervoltage band gap references $V_{REF1}$ and $V_{REF2}$ as reference voltages, a nominal value of 3.3 volts is assumed for regulated voltage $V_{DD\_PWR}$, a nominal value of 3.6 volts is assumed for regulated voltage $V_{DD\_PWR}$ under $BIST_{PWR}$, and a nominal value of 3.4 volts is assumed for controlled voltage $V_{DD\_PROT}$. Moreover, the nominal value of $V_{DD\_PROT}$ for activating $FLAG_{UV}$ must be less than 2.75 volts. In order to activate $FLAG_{OV}$, the average $((V_{DD\_PWR} + V_{DD\_PROT})/2)$ must be greater than 3.55 volts, whereas, in order to activate $FLAG_{OV}$ in $BIST_{OV}$, the average $((V_{DD\_PWR} + V_{DD\_PROT})/2)$ must be greater than 3.45 volts. The range of the operating voltage for digital logic DT and the load circuits is in the range from 2.7 volts to 3.6 volts.

In the present case, an undervoltage of the controller is detected by comparator $COMP_{UV}$ and reference $V_{REF2}$, in that the $FLAG_{UV}$ is set to the value 1 when voltage $V_{DD\_PROT}$ is lower than its threshold of 2.75 volts. An overvoltage of the controller is detected by comparator $COMP_{OV}$ and reference $V_{REF2}$, in that the $FLAG_{OV}$ is set to the value 1 when the $V_{OV}$ voltage is greater than the $V_{REF2}$ reference. Transistor $MOS_{OV}$ limits the maximum voltage, which is present at the positive input of comparator $COMP_{OV}$ when voltage $V_{DD\_PWR}$ is higher than 3.6 volts. The digital logic and the load circuits function correctly at a supply voltage between 2.7 volts and 3.6 volts.

During normal operation, when no defects are present, the protection controller permits a passage of total regulated voltage $V_{DD\_PWR}$ of 3.3 volts. This is due to the fact that the protection controller regulates voltage $V_{DD\_PROT}$ to a higher value of 3.4 volts. Therefore, transistor $MOS_{PROT}$ operates as a so-called source follower during normal operation, whereby voltage $V_{DD\_PROT}$ is equal to voltage $V_{DD\_PWR}$ of 3.3 volts. Since voltage $V_{OV}$ is less than the $COMP_{OV}$ threshold of $V_{REF2}$, $FLAG_{OV}$ is not set to the value 1 during normal operation.

The present invention offers a comprehensive coverage for defects within references $V_{REF1}$ and $V_{REF2}$, the control paths for voltages $V_{DD\_PWR}$ and $V_{DD\_PROT}$ and output transistors $MOS_{PWR}$ and $MOS_{PROT}$. If defects are present, the values of $V_{DD\_PWR}$, $V_{DD\_PROT}$, $V_{REF1}$ as well as $V_{REF2}$ change and result in the activation of $FLAG_{UV}$ or $FLAG_{OV}$. The setting of values for $FLAG_{UV}$ or $FLAG_{OV}$ is then utilized for initiating a controlled switch-off of load circuits, in order to avoid damage.

The means for detecting defects in each of the sub-circuits are described in greater detail in the following with reference to FIG. 1.

A defect of the voltage source for the $V_{REF1}$ reference voltage may result in the value of the voltage being higher or lower than the nominal value of 1.215 volts. If the $V_{REF1}$ reference voltage is less than the setpoint value 1.215 volts, so that voltages $V_{DD\_PWR}$ and $V_{DD\_PROT}$ are less than 2.75 volts, $FLAG_{UV}$ is set to the value 1 by comparator $COMP_{UV}$, which utilizes a second independent reference voltage $V_{REF2}$. If the $V_{REF1}$ reference voltage is higher than the setpoint value of 1.215 volts, so that voltage $V_{DD\_PWR}$ is higher than 3.7 volts and the protection controller regulates output $V_{DD\_PROT}$ to 3.4 volts, $FLAG_{OV}$ is set to the value 1, since the average $((V_{DD\_PWR} + V_{DD\_PROT})/2)$ is greater than 3.55 volts and, therefore, voltage $V_{OV}$ is greater than the threshold value of $V_{REF2}$ set in comparator $COMP_{OV}$.

Any defect of control path $V_{DD\_PWR}$, such as with respect to feedback resistors $R_1$, $R_2$, $R_3$ or transistor $MOS_{PWR}$, causes voltage $V_{DD\_PWR}$ to be higher or lower than the nominal value of 3.3 volts. If a defect in the control loop allows voltage $V_{DD\_PWR}$ to become less than 2.75 volts, in deviation from the nominal value of 3.3 volts, $FLAG_{UV}$ is set to the value 1, in order to indicate an undervoltage of the power controller. If a defect in the control loop, such as a drain-source short circuit of transistor $MOS_{PWR}$, allows voltage $V_{DD\_PWR}$ to deviate upward from the value 3.3 volts and this becomes greater than 3.7 volts, a setting of $FLAG_{OV}$ to the value 1 takes place, in order to indicate an overvoltage in the power controller.

A defect of the $V_{REF2}$ reference voltage may result in the value for $V_{REF2}$ being higher or lower than the nominal value of 1.215 volts. If the $V_{REF2}$ value is less than the setpoint value of 1.215 volts, so that the protection controller regulates output $V_{DD\_PROT}$ to a value less than $V_{DD\_PWR}$, a differential voltage develops across transistor $MOS_{PROT}$. If the difference is great enough, comparator $COMP_{OV}$ sets the value for $FLAG_{OV}$ to 1 in order to thereby indicate a likely defect in the $V_{REF2}$ reference voltage. Based on the aforementioned nominal values and equations (1) through (12b), the value of the $V_{REF2}$ reference voltage, at which $FLAG_{OV}$ is set to the value 1, may be calculated to be 1.084 volts and the corresponding voltage drop of voltage $V_{DD\_PROT}$ is 3.033 volts. Therefore, a defect of the $V_{REF2}$ voltage value, which reduces its target value by more than 0.131 volts, is indicated by way of the value 1 being set for $FLAG_{OV}$. The advantage of the provided overvoltage monitoring concept is that—although comparator $COMP_{UV}$ and the protection controller utilize the same reference $V_{REF2}$—defects in the $V_{REF2}$ reference, which result in a lower target value, may be detected by comparator $COMP_{OV}$ due to the value of $FLAG_{OV}$. The setting of the value for $FLAG_{OV}$ does not necessarily mean, in this case, that an overvoltage is present, but rather indicates a problem in the $V_{REF2}$ reference, which causes voltage $V_{DD\_PROT}$ to be lower than voltage $V_{DD\_PWR}$. If a considerable distinction must be made between an overvoltage with respect to $V_{DD\_PWR}$ and an undervoltage with respect to $V_{DD\_PROT}$, the specific embodiment described further below in conjunction with FIG. 3 and FIG. 4 may be utilized. If the $V_{REF2}$ value is higher than the target value of 1.215 volts, the protection controller attempts to regulate voltage $V_{DD\_PROT}$ to a higher value. Since the input of the protection controller is limited by the power controller, however, the voltage value for $V_{DD\_PROT}$ remains at 3.3 volts and, therefore, the value of voltage $V_{UV}$ remains unchanged. The higher value for voltage $V_{REF2}$ causes comparator $COMP_{UV}$ to set the value for $FLAG_{UV}$ to 1, however, since the $V_{REF2}$ value is higher than its threshold voltage $V_{UV}$. Based on the aforementioned nominal values and equations (1) through (12b), the increase of $V_{REF2}$, which results in $FLAG_{UV}$ being set to the value 1, may be calculated to be 1.458 volts. Therefore, a defect of $V_{REF2}$, which increases its target value by 0.243 volts, is indicated by way of $FLAG_{UV}$ being set to the value 1. The setting of the value for $FLAG_{UV}$ does not necessarily mean, in this case, that an undervoltage is present, but rather indicates a problem in the $V_{REF2}$ reference, which causes voltage $V_{UV}$ to be lower than reference $V_{REF2}$.

Every defect of control path $V_{DD\_PROT}$, such as with respect to feedback resistors $R_4$, $R_5$, $R_6$ or transistor $MOS_{PROT}$, causes voltage $V_{DD\_PROT}$ to be regulated to a lower or higher value than the nominal value of 3.4 volts. If a defect in the control loop causes voltage $V_{DD\_PROT}$ to deviate downward from the nominal value of 3.4 volts and become lower than 2.75 volts, $FLAG_{UV}$ is set to the value 1, in order to indicate a defect in the control path of voltage $V_{DD\_PROT}$. If a defect in the control loop, such as a drain-source short circuit of transistor $MOS_{PROT}$, results in voltage $V_{DD\_PROT}$ deviating upward from the nominal value 3.4 volts and is regulated to a higher value of 3.5 volts or more, the behavior of the value for $FLAG_{OV}$ will indicate this defect in the BIST (built-in self-test) phase. The BIST phase is carried out after the switch-on of the controller and before the activation of the load circuit. If there is a defect, the activation of the load circuit and all circuits is blocked until the defect has been eliminated. During the BIST phase, the power controller outputting voltage $V_{DD\_PWR}$ and comparator $COMP_{OV}$ are stimulated, in order to generate a certain output pattern from $FLAG_{OV}$. If this pattern changes, this indicates the presence of a defect in the control path for $V_{DD\_PROT}$. During normal operation, when no defects are present, digital portion DT stimulates the power controller by way of signal $BIST_{PWR}$, so that voltage $V_{DD\_PWR}$ increases to 3.6 volts. The protection controller regulates the output for voltage $V_{DD\_PROT}$ to 3.4 volts, and voltage $V_{OV}$, which is less than the reference value of voltage $V_{REF2}$, prevents the value 1 from being set for $FLAG_{OV}$ by comparator $COMP_{OV}$. Next, digital portion DT stimulates overvoltage comparator $COMP_{OV}$ by way of output signal $BIST_{OV}$, so that its comparison threshold changes. As a result, $FLAG_{OV}$ is set to the value 1, since the $V_{OV}$ voltage is now higher than reference voltage $V_{REF2}$. Therefore, if no defects are present, the expected output pattern of $FLAG_{OV}$ during the BIST phase is a value 0, followed by a value 1. If, however, control path $V_{DD\_PROT}$ has a defect, so that it, at 3.5 volts, is regulated to a higher value than the nominal value, the value for $V_{DD\_PROT}$ will increase to 3.5 volts during the BIST phase—if the protection controller is stimulated by digital portion DT by way of signal $BIST_{PWR}$—and, therefore voltage $V_{OV}$ will become greater than reference voltage $V_{REF2}$, whereby comparator $COMP_{OV}$ is prompted to set $FLAG_{OV}$ to the value 1. Therefore, in the presence of a defect in the control loop, the output pattern of $FLAG_{OV}$ is the value 1, followed by a value 1 again. Without a defect, however, a first value 0 is followed by the second value 1. Actually, in the BIST phase, a defect in the control loop is also detected when voltage $V_{DD\_PROT}$ deviates downward from the nominal value 3.4 volts and is regulated to a lower value of 3.3 volts or less. In this case, the output pattern of $FLAG_{OV}$ in the presence of a defect in the control loop is the value 0, followed by a value 0 again.

The same applies for a defect in transistors $MOS_{PWR}$, $MOS_{PROT}$ or in the control loop with respect to voltage $V_{DD\_PWR}$ or references $V_{REF1}$ and $V_{REF2}$. Actually, the BIST phase is passed only when the $V_{DD\_PWR}$ controller and $V_{DD\_PROT}$ controller as well as references $V_{REF1}$ and $V_{REF2}$ operate within their limits. Based on the aforementioned nominal values and equations (1) through (12b), a defect is produced in the BIST phase when one of voltages $V_{DD\_PWR}$ or $V_{DD\_PROT}$ deviates from its nominal value by approximately ±0.1 volts or when one of references $V_{REF1}$ or $V_{REF2}$ deviates from its nominal value by approximately ±0.034 volts. If one of the voltages or references deviates upward, the $FLAG_{OV}$ produces the value 1, followed by a value 1 again, in the BIST phase. If the voltage deviates downward, the $FLAG_{OV}$ produces the value 0, followed by a value 0 again, in the BIST phase.

Figure 2:
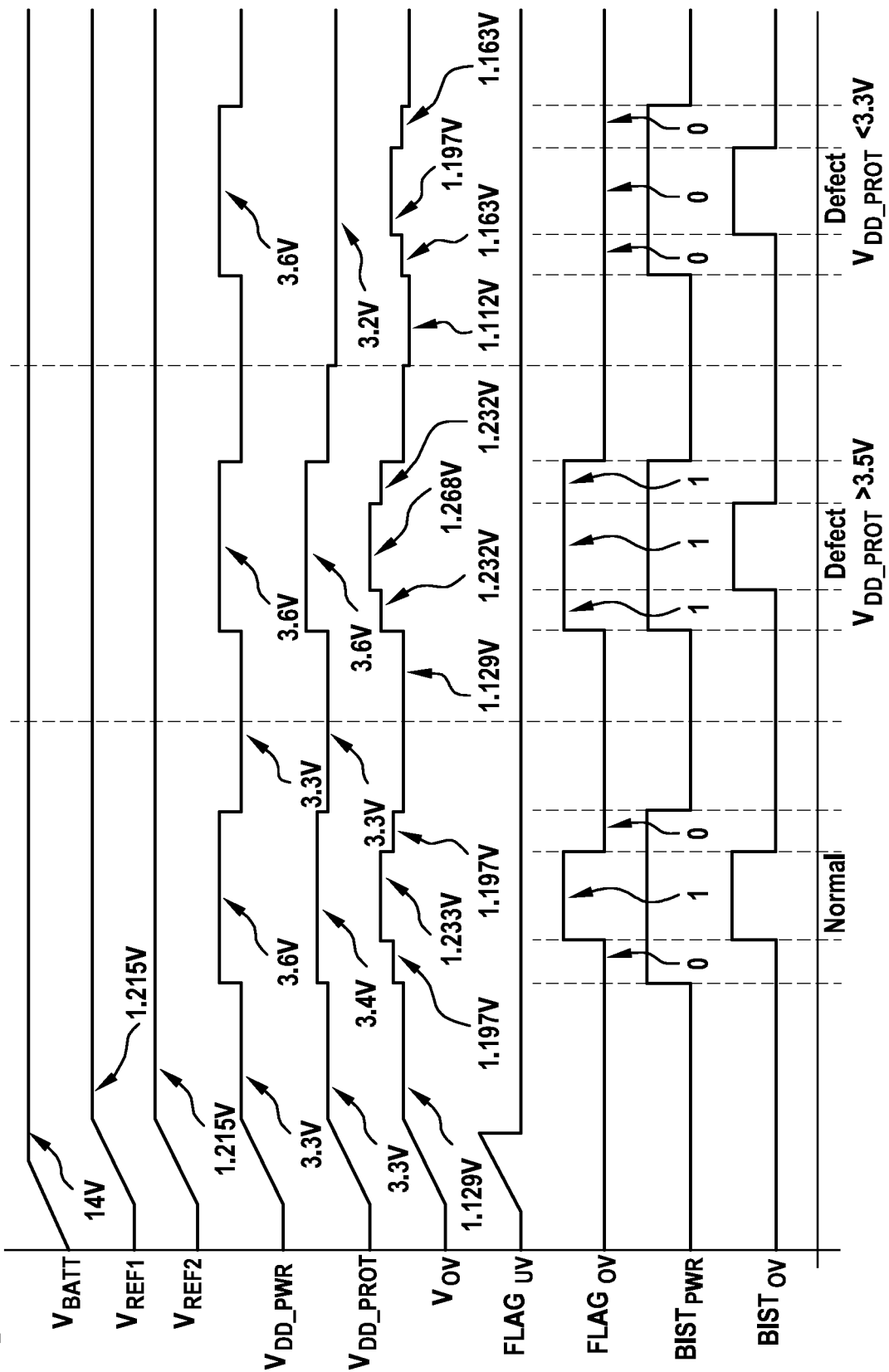
FIG. 2 shows, in a flow chart, the value changes during a BIST phase implemented according to the example circuit according to the present invention.

In FIG. 2, the sequences, explained with reference to FIG. 1, for the circuit according to the present invention are graphically represented on the basis of appropriate wave shapes during the BIST phase, with and without defect in the control path. In this case, for parameters $V_{BATT}$, $V_{REF1}$, $V_{REF2}$, $V_{DD\_PWR}$, $V_{DD\_PROT}$ and $V_{OV}$, the corresponding voltage values are indicated in volts, the logic or binary values 0 and 1 being assumed for parameters $FLAG_{UV}$, $FLAG_{OV}$, $BIST_{PWR}$ and $BIST_{OV}$, however. As explained above, the sequence of the values 0 and 1 represented first in the progression of parameter $FLAG_{OV}$ represents the presence of a defect-free $V_{DD\_PROT}$ control loop. The subsequently represented sequence of the values 1 and 1 or 0 and 0 for parameter $FLAG_{OV}$, however, indicates the presence of a defect in $V_{DD\_PROT}$ control loop.

Figure 3:
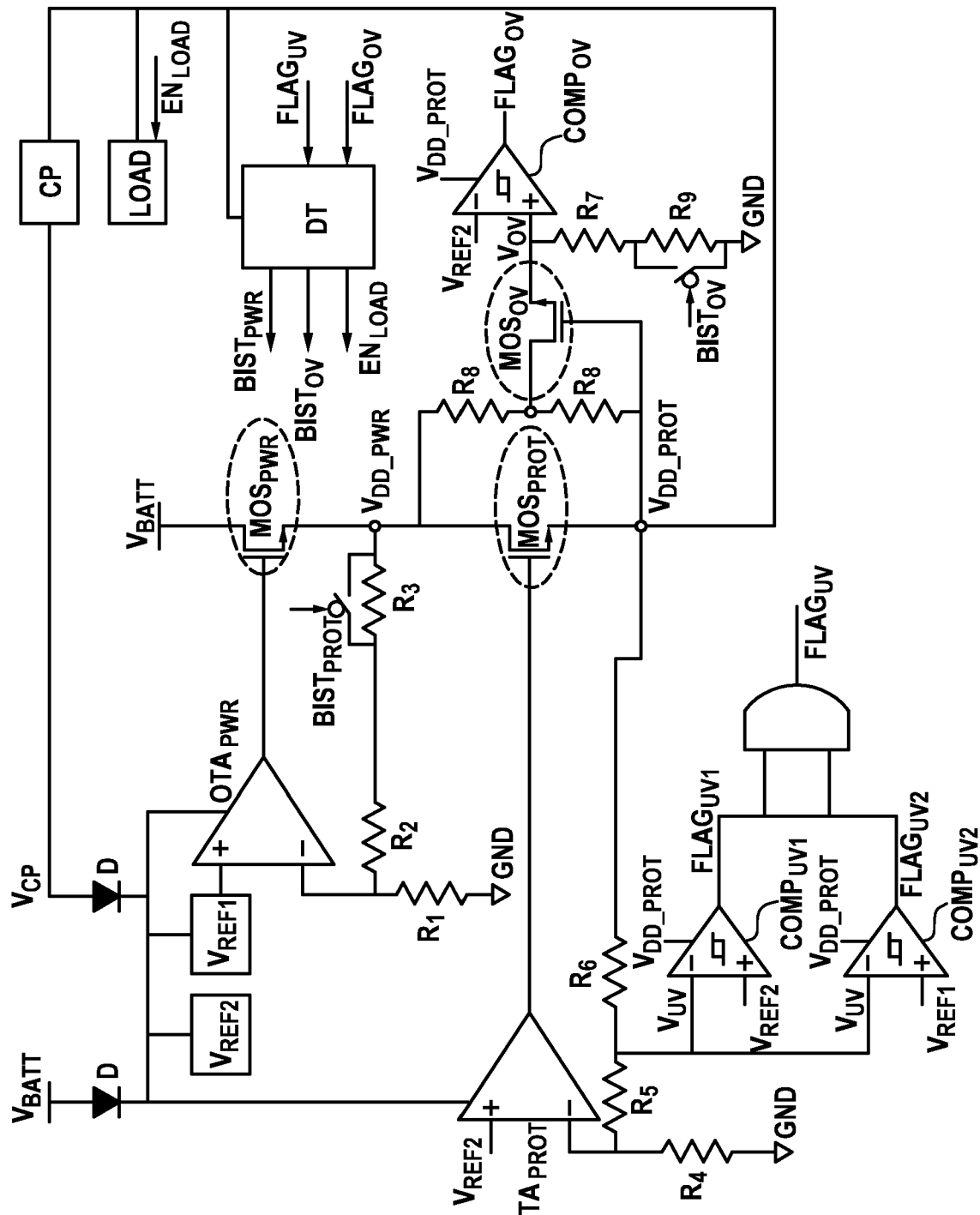
FIG. 3 shows one further specific example embodiment of the circuit according to the present invention, which enables a considerable distinction to be made between an overvoltage with respect to $V_{DD\_PWR}$ and an undervoltage with respect to $V_{DD\_PROT}$ due to a defect in the references.

In FIG. 3, a specific example embodiment of the circuit according to the present invention is represented, which enables a considerable distinction to be made between an overvoltage with respect to $V_{DD\_PWR}$ and an undervoltage with respect to $V_{DD\_PROT}$. In this case, the circuit additionally encompasses two double voltage detection comparators $COMP_{UV1}$ and $COMP_{UV2}$, which operate at reference voltages $V_{REF1}$ and $V_{REF2}$. In this specific embodiment, if voltage $V_{DD\_PROT}$ is considerably lower than 2.75 volts, the value for $FLAG_{UV}$ is additionally set to 1, due to interconnected logic AND-gate AND, by comparator $COMP_{UV2}$, which operates at reference voltage $V_{REF1}$. In this way, a defect in the $V_{REF2}$ reference is detected, in that $FLAG_{UV}$ and $FLAG_{OV}$ are set to the value 1.

Figure 4:
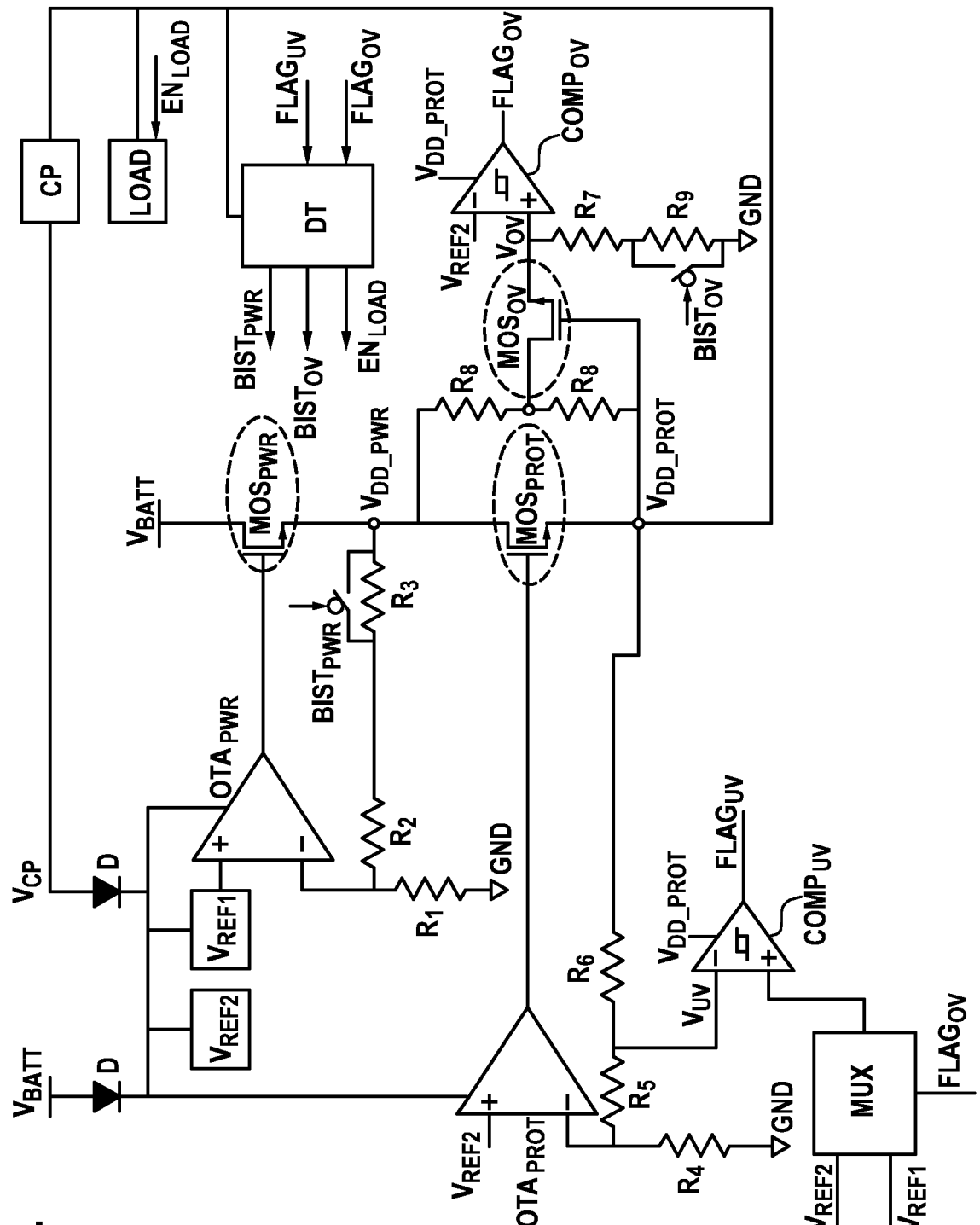
FIG. 4 shows a specific example embodiment of the circuit according to the present invention, which, as compared to the exemplary embodiment shown in FIG. 3, requires only one undervoltage comparator.

In FIG. 4, a specific example embodiment of the circuit according to the present invention is represented, which, in contrast to FIG. 3, encompasses only one undervoltage detection comparator $COMP_{UV}$ having a variable reference, in order to enable a considerable distinction to be made between overvoltage/undervoltage due to defects in the controllers and defects in the references. The $COMP_{UV}$ utilizes reference $V_{REF2}$ when the $FLAG_{OV}$ has the value 0 and utilizes reference $V_{REF1}$ when the $FLAG_{OV}$ has the value 1. In this specific embodiment, due to a defect in reference $V_{REF2}$ when voltage $V_{DD\_PROT}$ is considerably lower than 2.75 volts, the value for $FLAG_{UV}$ is additionally set to 1 due to the switch to the $V_{REF1}$ reference. In this way, a defect in the $V_{REF2}$ reference is detected, in that $FLAG_{UV}$ and $FLAG_{OV}$ are set to the value 1. Similarly, an overvoltage exists at $V_{DD\_PWR}$ when reference $V_{REF1}$ deviates to a higher value than 1.5 volts due to a defect. The protection controller limits voltage $V_{DD\_PROT}$ to 3.4 volts and, therefore, voltage $V_{UV}$ to 1.5 volts. Due to overvoltage, the $COMP_{OV}$ sets the $FLAG_{OV}$ to the value 1 and, therefore, switches the reference for $COMP_{UV}$ from $V_{REF2}$ to $V_{REF1}$. The higher value for voltage $V_{REF1}$ causes comparator $COMP_{UV}$ to set the value for $FLAG_{UV}$ to 1, however, since the $V_{REF1}$ value is higher than its threshold voltage $V_{UV}$. Therefore, a defect of $V_{REF1}$, which increases its target value by 0.285 volts, is indicated by way of $FLAG_{UV}$ and $FLAG_{OV}$ being set to the value 1.

Figure 5:
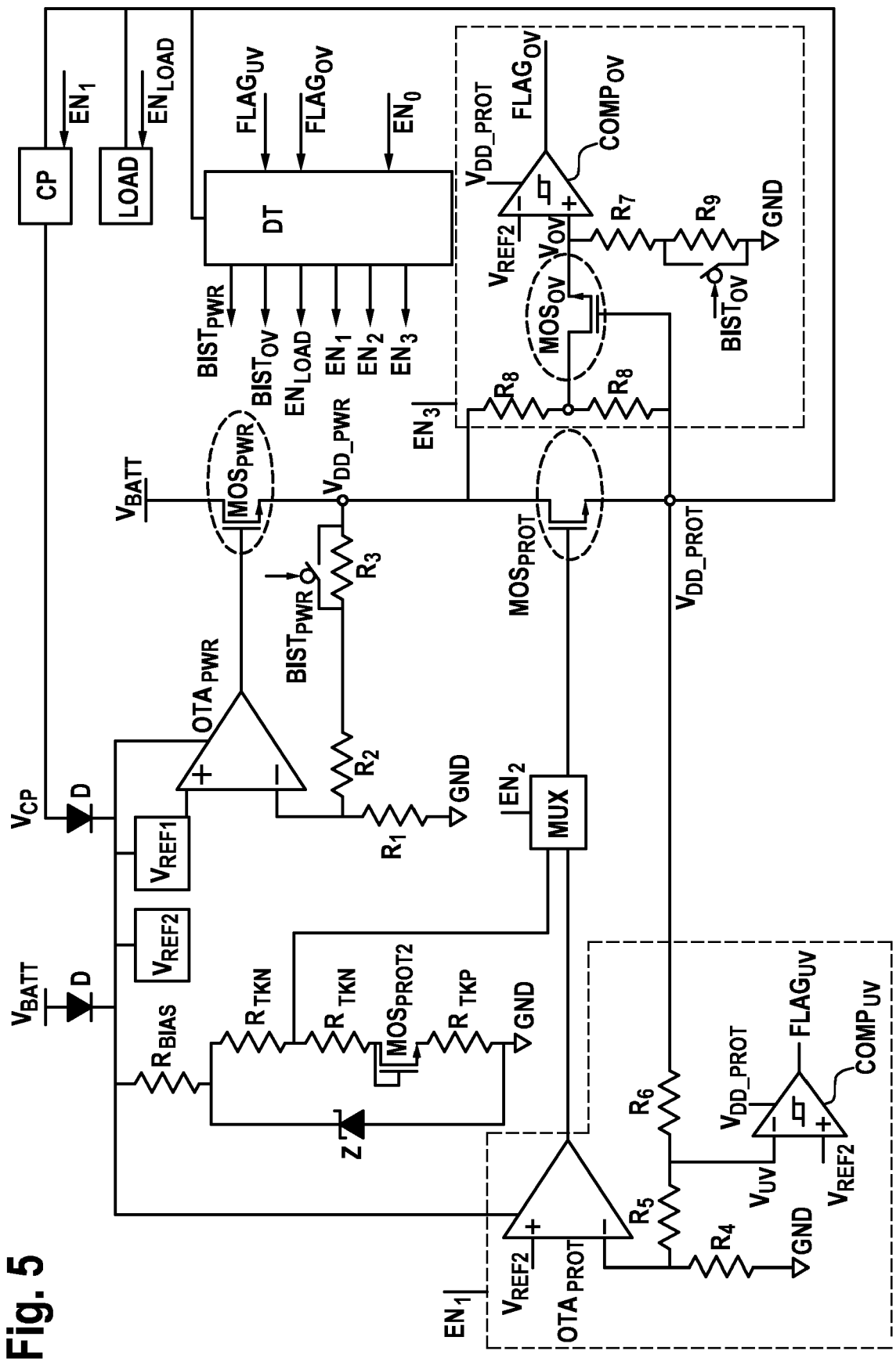
FIG. 5 shows an alternative specific example embodiment of the circuit according to the present invention allowing for a switch-off mode/stand-by mode.

In FIG. 5, an alternative specific example embodiment of the circuit according to the present invention is represented, which allows for a switch-off mode, in which overvoltage detection comparator $COMP_{OV}$ may be switched off with the aid of binary signal $EN_3$ and the protection controller may be switched off with the aid of binary signal $EN_1$, and protection transistor $MOS_{PROT}$ is passively regulated via $EN_2$, so that the voltage does not exceed the maximum operating voltage of 3.6 volts. This is possible due to the utilization of a parallel combination of a Zener clamping diode Z and resistor $R_{TKP}$ having a positive temperature coefficient and resistor $R_{TKN}$ having a negative temperature coefficient and a transistor threshold voltage of $MOS_{PROT2}$. The gate control voltage for protection transistor $MOS_{PROT2}$ is generated from the resistor divider formed from resistors $R_{TKP}$, $R_{TKN}$ and transistor threshold voltage $MOS_{PROT2}$, so that the gate voltage shows a temperature coefficient similar to that of the threshold voltage of protection transistor $MOS_{PROT}$. This results in a passive gate clamping voltage, which is stable across temperatures, which may limit voltage $V_{DD\_PROT}$ to a maximum of 3.6 volts. In this specific embodiment, the overvoltage detection logic and the protection control loop may be released upon receipt of an external release signal $EN_0$ by digital portion DT, which switches the complete application specific integrated circuit (ASIC) from the switch-off mode/stand-by mode to the active mode. Instead of the high-resistance resistor divider ($R_7$, $R_8$, $R_9$), alternatively, a differential voltage detector across the drain and source of transistor $MOS_{PROT}$ may be provided, in order to detect the voltage drop across transistor $MOS_{PROT}$. The same principle may also be adapted for controllers including other transistor types, such as PMOS or BJT.

What is claimed is:

1. An electrical circuit for detecting circuit defects and/or for preventing overvoltages in controllers, comprising:
    a power controller circuit including a first transistor, a control loop including an operation amplifier and a first reference voltage source, and feedback resistors;
    an overvoltage suppression circuit including a second transistor, a control loop including a second operation amplifier and a second reference voltage source, and second feedback resistors; and
    an undervoltage detection comparator including a variable reference source for detecting a defect in the first and second reference voltage sources,
    wherein the power controller circuit is configured to make a voltage available for the overvoltage suppression circuit, and the overvoltage suppression circuit is configured to make a protected voltage available.

2. The electrical circuit as recited in claim 1, further comprising:
    a circuit for detecting an undervoltage of the power controller, including a second comparator configured to compare a voltage of the second reference voltage source to a voltage obtained via the protected voltage.

3. The electrical circuit as recited in claim 2, wherein the second comparator, which is configured to detecting the undervoltage, is configured to output a binary value representing the undervoltage.

4. The electrical circuit as recited in claim 1, further comprising:
    a circuit configured to detect an undervoltage of the power controller, including two comparators, a comparison of a voltage obtained via a voltage of the first reference voltage source or the second reference voltage source to a voltage obtained using the protected voltage being provided via the two comparators.

5. The electrical circuit as recited in claim 4, wherein the two comparators are configured to output a binary value representing the undervoltage.

6. The electrical circuit as recited in claim 5, further comprising:
    a logic AND-gate configured to link binary values reflecting the undervoltage.

7. The electrical circuit as recited in claim 1, further comprising:
    a digital portion at which a provision of the protected voltage is provided.

8. The electrical circuit as recited in claim 7, wherein the digital portion includes inputs for receiving binary values and outputs for transmitting binary values.

9. The electrical circuit as recited in claim 1, wherein a supply of the first reference voltage source, the second reference voltage source, the power controller circuit, and the overvoltage suppression circuit, is provided using an external battery voltage.

10. A electrical circuit for detecting circuit defects and/or for preventing overvoltages in controllers, comprising:
    a power controller circuit including a first transistor, a control loop including an operation amplifier and a first reference voltage source, and feedback resistors;
    an overvoltage suppression circuit including a second transistor, a control loop including a second operation amplifier and a second reference voltage source, and second feedback resistors;
    wherein the power controller circuit is configured to make a voltage available for the overvoltage suppression circuit, and the overvoltage suppression circuit is configured to make a protected voltage available; and
    a third transistor, a gate terminal of the third transitory being connected to a source terminal of the second transistor, the third transistor configured to limit an overvoltage at a source terminal of the third transistor.

11. The electrical circuit as recited in claim 10, wherein an input of a first comparator is connected at the source terminal of the third transistor, the first comparator configured to detecting an overvoltage by comparing a limited voltage to a voltage of the second reference voltage source.

12. The electrical circuit as recited in claim 11, wherein the first comparator, which is configured to detect the overvoltage, is configured to output a binary value representing the overvoltage.

13. A electrical circuit for detecting circuit defects and/or for preventing overvoltages in controllers, comprising:
    a power controller circuit including a first transistor, a control loop including an operation amplifier and a first reference voltage source, and feedback resistors;
    an overvoltage suppression circuit including a second transistor, a control loop including a second operation amplifier and a second reference voltage source, and second feedback resistors;
    wherein the power controller circuit is configured to make a voltage available for the overvoltage suppression circuit, and the overvoltage suppression circuit is configured to make a protected voltage available; and
    a circuit configured to detect a defect in the first and second reference sources, which causes an overvoltage of the power controller or an undervoltage of a protection controller, including an undervoltage detection comparator having a variable reference source.

* * * * *